United States Patent
Vromans et al.

(10) Patent No.: US 7,898,352 B2
(45) Date of Patent: Mar. 1, 2011

(54) RADIO FREQUENCY PWM & PPM MODULATOR

(75) Inventors: Jan Vromans, Maastricht (NL); Gerben W. De Jong, Veldhoven (NL); Mihai A. T. Sanduleanu, Maastricht (NL)

(73) Assignee: NXP B.V., Eindhoven (NL)

(*) Notice: Subject to any disclaimer, the term of this patent is extended or adjusted under 35 U.S.C. 154(b) by 246 days.

(21) Appl. No.: 12/293,812

(22) PCT Filed: Mar. 26, 2007

(86) PCT No.: PCT/IB2007/051041
§ 371 (c)(1),
(2), (4) Date: Sep. 20, 2008

(87) PCT Pub. No.: WO2007/110831
PCT Pub. Date: Oct. 4, 2007

(65) Prior Publication Data
US 2010/0231314 A1  Sep. 16, 2010

(30) Foreign Application Priority Data
Mar. 27, 2006  (EP) ................... 06111761

(51) Int. Cl.
*H03C 3/00* (2006.01)
(52) U.S. Cl. .............. 332/103; 332/109; 332/112; 375/27; 375/261; 375/264; 375/271; 330/10; 330/136
(58) Field of Classification Search ........... 332/103, 332/109, 112; 375/27, 261, 264, 271; 330/10, 330/136
See application file for complete search history.

(56) References Cited

U.S. PATENT DOCUMENTS 6,794,931 B2   9/2004  Kenington
7,358,829 B2 * 4/2008  Oka ........................... 332/145

FOREIGN PATENT DOCUMENTS

EP   1271870 A   1/2003

OTHER PUBLICATIONS

Cox D C; "Linear Amplification with Nonlinear Components". IEEE Transactions and Communications, COM-22, pp. 1942 to 1945, Dec. 1974. Piscataway, NJ, USA.
Schreier R et al; "Bandpass Sigma-Delta Modulation". Electronics Letters, IEE Stevenage, GB, vol. 25, No. 23. Nov. 9, 1989. pp. 1560-1561.
Andraka R; "Survey of Cordic Algorithms for FPGA Based Computers". ACM SIGDA International Symposium on Field Programmable Gate Arrays. FPGA '98. Monterey, CA, Feb. 22-24, 1998. vol. 6th Conf., pp. 191-200. ACM, New York, NY, US.

* cited by examiner

*Primary Examiner*—Arnold Kinkead

(57) ABSTRACT

The present invention relates in general to transferring the envelope information of a polar modulated signal to a varying pulsewidth signal, while the phase modulation is direct transferred to the phase modulation of this PWM signal. Accordingly, the resultant signal is a PWM-PPM-signal. Such a signal can efficiently amplified by use of switching amplifying stages. By the present invention four pre-distorted baseband signals are applied basically to 4 linear RF mixers and a two adders, which are, the only needed external RF building blocks to build the modulator according to the invention. That is, the basic idea of the invention resides in the way of modulation of the four baseband signals and the way of combining of the RF modulated signals.

10 Claims, 5 Drawing Sheets

RADIO FREQUENCY PWM & PPM MODULATOR

BACKGROUND OF THE INVENTION

1. Field of the Invention

The present invention relates to a method for generating a first and a second phase modulated carrier signal from a input signal, in particular a polar modulated input signal, for construction of a driving signal for a power amplifier according to claim 1, and a modulator for generating a first and a second phase modulated carrier signal from a polar modulated input signal according to claim 7.

2. Description of Related Art

Existing types of FM-modulation schemas, for example Gaussian Minimum Shift Keying (GMSK) as in the Global System for Mobile communications (GSM), are using the spectrum relatively inefficiently. One reason for this is the fact that FM modulations do not carry information in the signal envelope. In other words, ideal FM modulations comprise a constant signal envelope, wherein the amplitude of the transmission signal does not carry information. In the next generations of digital cellular radio systems, use of the Quadrature Amplitude Modulation (QAM) will be standard, in order to reach a higher spectrum efficiency.

Polar-modulations, as the afore-mentioned QAM, have a non-constant signal envelope. Accordingly, amplification of such signals requires linear power amplifiers. However, amplifiers in linear mode or linear configuration are less efficient than class-C or class-D power amplifiers currently used, for instance, in FM-type modulators. Further, conventional linear power amplifiers cause heat and/or operation time problems in transmitter equipment, in particular in thermally limited equipment alike mobile terminals.

In order to reduce such effects, new transmitter architectures based on switching mode power amplifiers have been introduced. Switching mode power amplifiers can theoretically reach a power efficiency of 100% and do not alter significantly the phase of the input modulation signal, but they are extremely amplitude non-linear. In this respect, it is known from Linear Amplification with Nonlinear Components (LINC), proposed by D. C. Cox in "Linear Amplification with Nonlinear Components", IEEE Transactions an Communications, COM-22, pp. 1942 to 1945, December 1974, that any bandpass signal with both amplitude and phase variations can be represented by two pulse modulated signals which are of constant amplitude and have only phase variations. Hence, a proper method may be to convert a complex modulation signal to a respective pulse signal that comprises pulse width modulated (PWM) and pulse phase modulated (PPM) pulses, a so-called phase modulated pulse width modulated signal (PWM-PPM).

Beside the general concept discussed above, there are several ways to control a Power Amplifier (PA) in the prior art. One class of polar-modulation solutions is those where the AM-component is added via modulation of the supply-voltage of the RF Power Amplifier. For instance, U.S. Pat. No. 6,794,931 related to this approach. In order to be power efficient the supply-voltage modulation should be done via an efficient switching DC-DC converter. However, it is difficult to achieve a high modulation bandwidth as well as to get rid of the switching ripple.

A second class of polar-modulation solutions are those where the input of a switching PA is driven with a two-level PWM-signal, which can be generated by comparing the AM- and PM-modulated carrier signal with a triangular (or saw-tooth) signal with a fundamental frequency being at least twice the carrier frequency. Issues with this solution are the high PA switching frequency, causing over-sampling, and the severe linearity requirements on the triangular (or saw-tooth) signal. Besides, the carrier already should have been linearly AM modulated before the PWM conversion takes place.

A third class of polar-modulation solutions are those where the input of the switching PA is driven with a two-level pulse-density signal which may be generated by a bandpass sigma-delta converter as, for instance, described by R. Schier in "Bandpass Sigma-Delta Modulation", Electronic Letters, Vol. 25, No. 23, November 1989. An important issue with this solution is the required high PA switching frequency, leading to a significant over sampling ratio.

BRIEF SUMMARY OF THE INVENTION

As discussed above, generating a phase-modulated PWM-signal is not trivial at RF frequencies, because conventional methods with, for instance, a comparator and a linear ramping reference signal fail to reach the high linearity requirements of the ramping reference carrier. Hence, there is a need for an efficient conversion method and apparatus for converting a polar modulated input signal to a two or tri-state signal without loss of the original information. It is therefore one objective of the present invention to provide a method and apparatus for generating phase modulated PWM-signals, which can be used for driving power amplifiers in the power efficient switching mode. As a general objective the afore-mentioned problems should be avoided or the effect thereof should at least be reduced.

The object is solved by a method for generating a first and a second phase modulated carrier signal from a polar modulated input signal for construction of a driving signal for a power amplifier according to claim 1. Accordingly, the method comprises the steps of: deriving a first modulator argument and second modulator argument by summing and subtracting, respectively, a first phase information corresponding to the amplitude of an input signal to and from, respectively, a second phase information corresponding to the phase of the input signal; generating a first and second baseband signal by respectively transforming the first modulator argument with a first sin-functionality and a first cos-functionality and generating a third and forth baseband signal by respectively transforming the second modulator argument with a second sin-functionality and a second cos-functionality; mixing respectively the first and third baseband signal with a cos-component of a quadrature carrier signal to a first and third carrier product and mixing respectively the second and forth baseband signal with a sin-component of the quadrature carrier signal to a second and forth carrier product; and adding the first to the second carrier product and the third to the forth carrier product, respectively, to output a first and a second phase modulated carrier signal, respectively.

Further, the object is solved by a modulator for generating a first and a second phase modulated carrier signal from a polar modulated input signal according to claim 7. Accordingly, the modulator comprises: pre-distortion means configured to derive a first modulator argument and second modulator argument as a sum and a difference, respectively, of a first phase information corresponding to the amplitude of an input signal and a second phase information corresponding to the phase of the input signal; baseband signal generating means connected to the pre-distortion means, the baseband signal generating means configured to generate a first baseband signal and a second baseband signal by respectively transforming the first modulator argument by a first sin-functionality and a first cos-functionality, and configured to generate a third baseband signal and a forth baseband signal by respectively transforming the second modulator argument by a second sin-functionality and by a second cos-functionality; first linear mixing means and second linear mixing means each configured to multiply a input signal with a cos-component of a quadrature carrier signal to output a first carrier product and second carrier product, respectively, and third linear mixing means and forth linear mixing means each configured to multiply the second baseband signal and forth baseband signal, respectively, with a sin-component of the quadrature carrier signal to output a third carrier product and forth carrier product, respectively, wherein the first baseband signal is input to the first linear mixing means, the second baseband signal is input to the third linear mixing means, the third baseband signal is input to second linear mixing means, and the forth baseband signal is input to the forth linear mixing means; first summing means configured to sum the first carrier product and the third carrier product and configured to output a first phase modulated carrier signal; and second summing means configured to sum the second carrier product to the forth carrier product and configured to output a second phase modulated carrier signal.

A second aspect of the invention concerns the use of the first phase modulated carrier signal and a second phase modulated carrier signal. Accordingly, in a first embodiment, the method comprises further the step of limiting each of the first and the second phase modulated carrier signals to a first two-level phase modulated carrier signal and a second two-level phase modulated carrier signal. The first embodiment comprises further the step of combining the first and the second two-level phase modulated carrier signals by a NOR-functionality to a first phase modulated pulse width signal, and combining the first and the second two-level phase modulated carrier signals by a AND-functionality to a second phase modulated pulse width signal. Advantageously, each of the first and second phase modulated pulse width signal can be used for driving an unbalanced power amplifier. It is worth noting, that it is clear for the skilled person that the first and the second two-level phase modulated carrier signals may be combined by other logical functions to achieve the signals according to the invention.

In a further development of the first embodiment the method of the invention comprises further the step of forming a balanced phase- and pulse width-modulated carrier signal for driving a power amplifier by combining the first and the second phase modulated pulse width signal by means of differential amplifying. Thus, a further reduction of unwanted frequency components can be achieved.

According to a second embodiment, which may be also used together with the first embodiment, the method may comprise further the step of merging the first and the second phase modulated carrier signals to an envelope and phase modulated carrier signal, which can be used for driving a power amplifier in linear mode. Such a linear modulator can ideally be use for linear PA concepts with nearly no changes in the external RF circuits. Moreover, the combination of the first and second embodiment as a further development of the invention provides for flexibility needed for a multi-mode configuration, in which a PWM-PPM-mode and a LM-mode are selectively available.

Additionally, in case of constant envelope signals (only PM) or when the AM modulation is done after a driven switching power device the pulse width modulation could be used for AGC or Power control. The Power Control method can also be used in combination with the conventional way of Power Control by simply adapting the power supply of the PA. The combination will result in a higher dynamic range for the power control.

As to the modulator according to the invention, in a first embodiment thereof, the modulator further comprises a first combining means having a first and second limiting means or signum-functionality configured to limit the first phase modulated carrier signal and the second phase modulated carrier signal, respectively, to a first two-level phase modulated carrier signal and a second two-level phase modulated carrier signal, respectively. The first combining means further comprise a NOR-functionality and a AND-functionality, the first phase modulated carrier signal and the second phase modulated carrier signal both input to the NOR-functionality and the AND-functionality, wherein the NOR-functionality and the AND-functionality are respectively configured to combine the first two-level phase modulated carrier signal and the second two-level phase modulated carrier signal, wherein an output of the NOR-functionality is a first phase modulated pulse width signal and an output of the AND-functionality is a second phase modulated pulse width signal. The first and second limiting means or a signum-functionality may be implemented by operational amplifying means, which are arranged in a comparator configuration.

In a second embodiment the modulator further comprises comprising a second combining means having summing means configured to sum the first phase modulated carrier signal and the second phase modulated carrier signal to an envelope- and phase-modulated carrier signal. This signal can be used for driving a power amplifier in linear configuration. Hence, the second embodiment, which may be called a linear modulation mode (LM-mode) of the modulator, provides for a linear modulated carrier signal, which can ideally be use for linear PA concepts with nearly no changes in the external RF circuits.

In a further development, the second combining means may further comprise inversion means connected to the output of the summing means and configured to provide a inverse version of the envelope- and phase-modulated carrier signal. From the two versions of the envelope- and phase-modulated carrier signal also a balanced phase- and pulse width-modulated carrier signal for driving a balanced power amplifier can be achieved by combining the two versions of the envelope- and phase-modulated carrier signal by means of differential amplifier. Thus, the balanced signals provide for a further reduction of unwanted frequency components.

Also the second embodiment of the modulator may be used together with the first embodiment thereof as a combination of the first and second embodiment. This further development of the invention provides for the flexibility, discussed in connection with the method of the invention. Thus a multi-mode modulator can be implemented, in which a PWM-PPM-mode and a LM-mode are selective available. Hence, the modulator according to the basic concept of the invention can advantageously provide for maximum flexibility. Thus, the modulator is suitable for use in multi-mode concepts, which open a broad field of applications as efficient modulated transmitters for WLAN, WPAN, Blue-Tooth, OFDM, GSM, UMTS, CDMA, and low-power mobile communication devices and so on.

In a nutshell, the general concept of the invention is based on the perception that the AM or envelope information of a modulated input signal can be transferred to a varying pulse-width signal, (a PWM signal), while the phase modulation can direct be transferred to the phase modulation of this PWM signal. Accordingly, the resultant signal is a PWM-PPM-signal. Such a signal can efficiently amplified by use of switching amplifying stages in balanced as well as in unbalanced configuration. The present invention needs merely 4 linear RF mixers and two adders, which are the only, needed external RF building blocks to build the modulator. That is to say, the basic idea of the invention resides in the way of modulation of the four baseband signals and the way of combining of the RF modulated signals. In particular, the invention does not need a linear ramping signal and does not have a bandwidth limitation concerning the external modulator. The only bandwidth limitation is the bandwidth of the used D/A-converters, which provide the baseband signals.

BRIEF DESCRIPTION OF THE DRAWING

The invention will be more completely understood in consideration of the following detailed description of embodiments of the invention in connection with the accompanying drawing, in which.

DETAILED DESCRIPTION OF THE INVENTION

Figure 1:
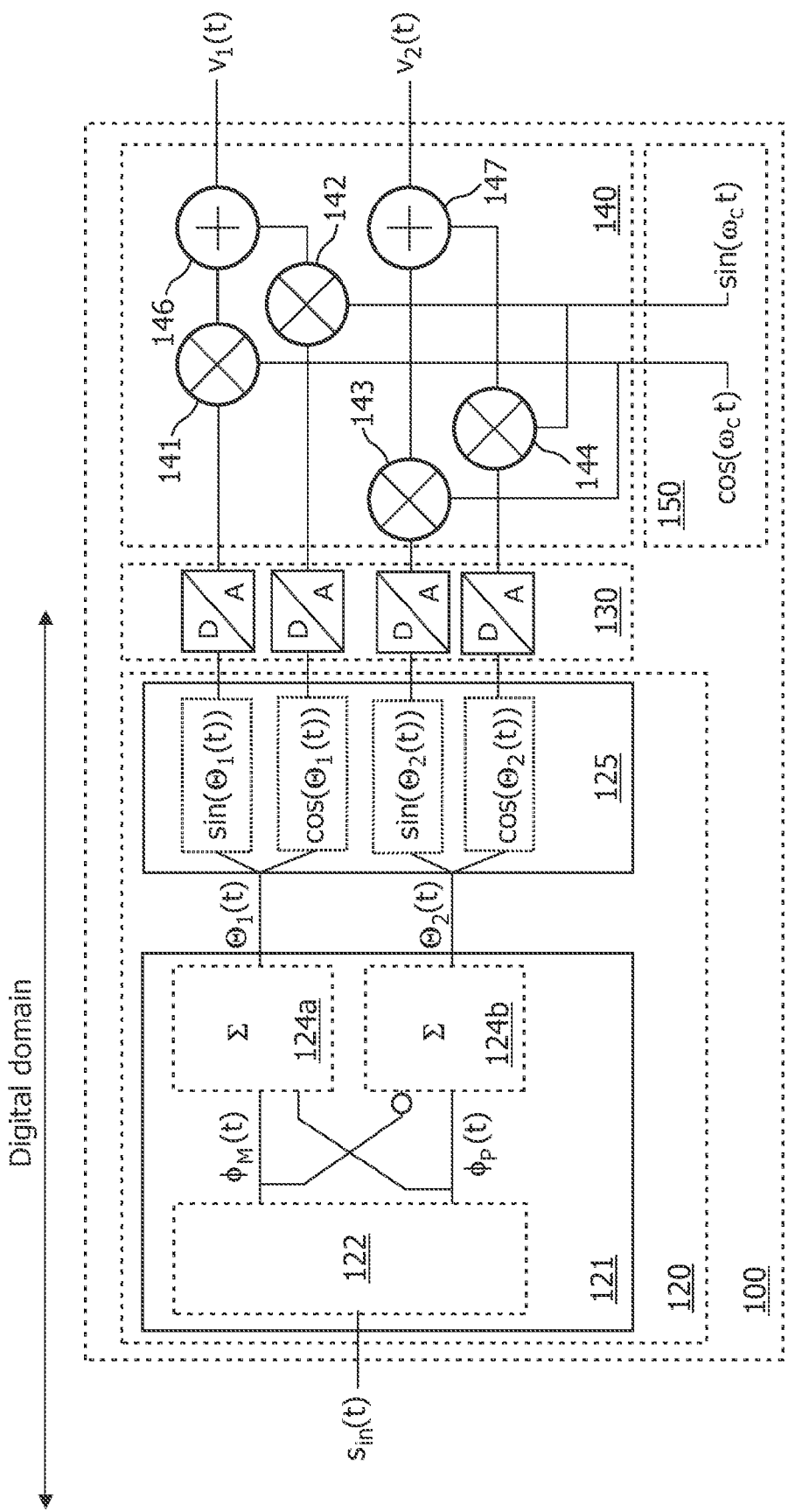
FIG. 1 shows a block diagram illustrating the method and the basic structure of the core of the new modulator according to the invention.

According to the invention, the transfer of amplitude modulation (AM) information (or envelope information) of a modulated signal to a varying pulse width signal (PWM-signal) is considered. Phase modulation (PM) information can be directly transferred to the phase modulation of the PWM signal. In case of a polar modulated input signal, the resultant signal is a PWM-PPM-signal, which can efficiently amplified by use of amplifiers in switching mode.

First of all for better explanation, as broadest case, an input signal $s_{in}(t)$ is assumed to be a polar modulated signal, which can be represented by a amplitude component $A(t)$ and a phase component $\delta(t)$. Such an input signal can also be represented as a complex baseband signal having an in-phase component $I(t)$ and a quadrature component $Q(t)$. It is worth noting that the input baseband signal may be represented in several different mathematical forms, but the effect will be equal.

In the following, the needed pre-distortion of the baseband signal components will be explained in detail. The description of a complex baseband signal in Cartesian format is:

$$s_{in}(t) = I(t) + jQ(t) \qquad (1a)$$

The phase $\Phi_P(t)$ and the normalized envelope $A_{env}(t)$ of the signal of equation (1a) are given by:

$$\Phi_P(t) = \arctan\left(\frac{Q(t)}{I(t)}\right) = \arg(s_{in}(t)) \qquad (1b)$$

$$A_{env}(t) = \frac{\sqrt{I(t)^2 + Q(t)^2}}{\sqrt{\hat{I}^2 + \hat{Q}^2}}$$

The Fourier series of a pulse train with pulses as depicted in FIG. 7 is:

$$f(t) = d \cdot h + \frac{2h}{\pi}\sum_{n=1}^{\infty}\frac{\sin(nd\pi)}{n}\cos(n\omega_c t) \qquad (2a)$$

In the following, the relation between the amplitudes of the fundamental frequency and its harmonics and the duty cycle will be derived. The amplitude of the n-th harmonic of the fundamental frequency as function of the duty cycle is given by:

$$A_n = \frac{2h}{\pi}\frac{\sin(nd\pi)}{n} \qquad (2b)$$

For the PWM-modulation according to the present invention a continuous decreasing or increasing range for $A_n$ as function of d may be achieved by respective pre-distortion. For h=1 and n=1, which corresponds to the first harmonic, for the duty cycle d the range is [0 ... 0.5] and for the amplitude $A_1$ the range is [0 ... 2/π]. Accordingly, from equation (2b) above, the duty cycle d(t) becomes for h=1 and n=1:

$$d(t) = \frac{1}{\pi}\arcsin\left(\frac{\pi A_n(t)}{2}\right) \qquad (3a)$$

That is to say, control of the duty cycle with an envelope signal which is normalized in the range from 0 to 2/π will result in a linear pulse width modulation of the first harmonic of the PWM signal with the envelope information as modulation information. The equation (3a) can be further simplified by normalizing the envelope $A_{env}(t)$ to the range [0 ... 1]. Now, the final pre-distortion for the amplitude $A_{env}(t)$ leads to the duty cycle d(t) as:

$$d(t) = \frac{1}{\pi}\arcsin(A_{env}(t)) \qquad (3b)$$

The duty cycle information d(t), represented by equation (3b), can be translated into a phase modulation (PM), according the following equations:

$$\hat{\Phi}_M = \frac{\pi}{2} \qquad (4a)$$

$$\Phi_M(t) = (1 - 2d(t))\hat{\Phi}_M \qquad (4b)$$

Further, the phase information of the input signal $s_{in}(t)$ may be directly used for modulation of a PWM signal and indicated with:

$$\Phi_P(t) = \arg(s_{in}(t)) \qquad (5)$$

Now with reference to FIG. 1, the core of the modulator 100 according to the present invention will be described, wherein the signals are explained from left to the right starting in the digital domain with the modulator input signal $s_{in}(t)$. The input signal $s_{in}(t)$ may be a complex signal represented by its I and Q components. Firstly, pre-distortion means 122 generated the signals $\Phi_M(t)$ and $\Phi_P(t)$ according to equations (1) to (5) from the input signal $s_{in}(t)$. Next, the predistorted signals $\Phi_M(t)$ and $\Phi_P(t)$ are combined to the first and second modulator argument $\Theta_1(t)$ and $\Theta_2(t)$ by respective summers 124a, 124b according to the following equations (6) and (7):

$$\Theta_1(t)=\Phi_P(t)+\Phi_M(t) \quad (6)$$

$$\Theta_2(t)=\Phi_P(t)-\Phi_M(t) \quad (7)$$

The first and second modulator argument $\Theta_1(t)$ and $\Theta_2(t)$ of equations (6) and (7) are subject to respective trigonometric sin-transformation and cos-transformation by transformation means 125 in order to generate first to forth baseband signals $\sin(\Theta_1(t))$, $\cos(\Theta_1(t))$, $\sin(\Theta_2(t))$, and $\cos(\Theta_2(t))$.

The complete processing of the input signal $s_{in}(t)$ may be implemented by means of a digital signal processor 120. For instance, it is possible to use a coordinate rotation digital computer (CORDIC) to perform the functions in the digital domain of block 120. CORDIC is a term for shift-add algorithms for computing a wide range of functions including certain trigonometric, hyperbolic, linear, and logarithmic functions. Further information on CORDIC can be gathered from "A survey of CORDIC algorithms for FPGA based computers" by Ray Andraka, FPGA 1998, proceedings of the 1998 ACM/SIGDA Sixth International Symposium on Field Programmable Gate Arrays, February 22-24, Monterey, Calif.

There is a digital-to-analog (D/A)-converter bank 130, which may comprise four D/A-converters for each of the four baseband signals $\sin(\Theta_1(t))$, $\cos(\Theta_1(t))$, $\sin(\Theta_2(t))$, and $\cos(\Theta_2(t))$. Here the first to forth baseband signals $\sin(\Theta_1(t))$, $\cos(\Theta_1(t))$, $\sin(\Theta_2(t))$, and $\cos(\Theta_2(t))$ are converted to respective analog baseband signals.

Then, the first baseband signal $\sin(\Theta_1)$ is input a first linear mixing means 141, which multiplies the first baseband signal $\sin(\Theta_1)$ with a cos-component $\cos(\omega_c t)$ of a quadrature carrier signal), which is provided by a carrier generator means 150, to output a first carrier product $\sin(\Theta_1)\cos(\omega_c t)$.

The second baseband signal $\cos(\Theta_1)$ is input to the second linear mixing means 142, which multiplies the second baseband signal $\cos(\Theta_1)$ with a sin-component $\sin(\omega_c t)$ of a quadrature carrier signal, which is provided by the carrier generator means 150, to output a second carrier product $\cos(\Theta_1)\sin(\omega_c t)$.

The third baseband signal $\sin(\Theta_2)$ is input to third linear mixing means 143, which multiplies the third baseband signal $\sin(\Theta_2)$ with a cos-component $\cos(\omega_c t)$ of a quadrature carrier signal, which is provided by the carrier generator means 150, to output a third carrier product $(\sin(\Theta_2)\cos(\omega_c t))$.

The forth baseband signal $\cos(\Theta_2)$ is input to forth linear mixing means 144, which multiplies the forth baseband signal $\cos(\Theta_2)$ with a sin-component $\sin(\omega_c t)$ of a quadrature carrier signal, which is provided by the carrier generator means 150, to output a forth carrier product $\cos(\Theta_2)\sin(\omega_c t)$.

Next, first summing means 146 sum the first carrier product $\sin(\Theta_1)\cos(\omega_c t)$ and the second carrier product $\cos(\Theta_1)\sin(\omega_c t)$ and output a first phase modulated carrier signal $v_1$. Second summing means 147 sum the third carrier product $\sin(\Theta_2)\cos(\omega_c t)$ to the forth carrier product $\cos(\Theta_2)\sin(\omega_c t)$ and configured to output a second phase modulated carrier signal $v_2$.

The phase modulated carriers $v_1(t)$ and $v_2(t)$ are represented by equations (8) and (9):

$$v_1(t)=\sin(\Theta_1(t))\cos(\omega_c t)+\cos(\Theta_1(t))\sin(\omega_c t)=\sin(\omega_c t+\Theta_1(t)) \quad (8)$$

$$v_2(t)=\sin(\Theta_2(t))\cos(\omega_c t)+\cos(\Theta_2(t))\sin(\omega_c t)=\sin(\omega_c t+\Theta_2(t)) \quad (9)$$

Considering equation (6) and (7) results in:

$$v_1(t)=\sin(\omega_c t+\Phi_P(t)+\Phi_M(t)) \quad (10)$$

$$v_2(t)=\sin(\omega_c t+\Phi_P(t)-\Phi_M(t)) \quad (11)$$

That is, by the core of the modulator 100 of the present invention the phase modulated carriers $v_1(t)$ and $v_2(t)$ carry the modulation information of the input baseband signal such that the phase information $\Phi_P(t)$ of the baseband signal is added to the phase of both phase modulated carriers $v_1(t)$ and $v_2(t)$, while the information corresponding to the amplitude component $A_{env}(t)$ of the input signal $s_{in}(t)$ is respectively added to the phase of the phase modulated carrier $v_1(t)$ and subtracted of the phase of the phase modulated carrier $v_2(t)$.

In the following according to the second aspect of the invention, several applications of the output signals of the modulator core 100, the phase-modulated carriers $v_1(t)$ and $v_2(t)$, are described.

Figure 2:
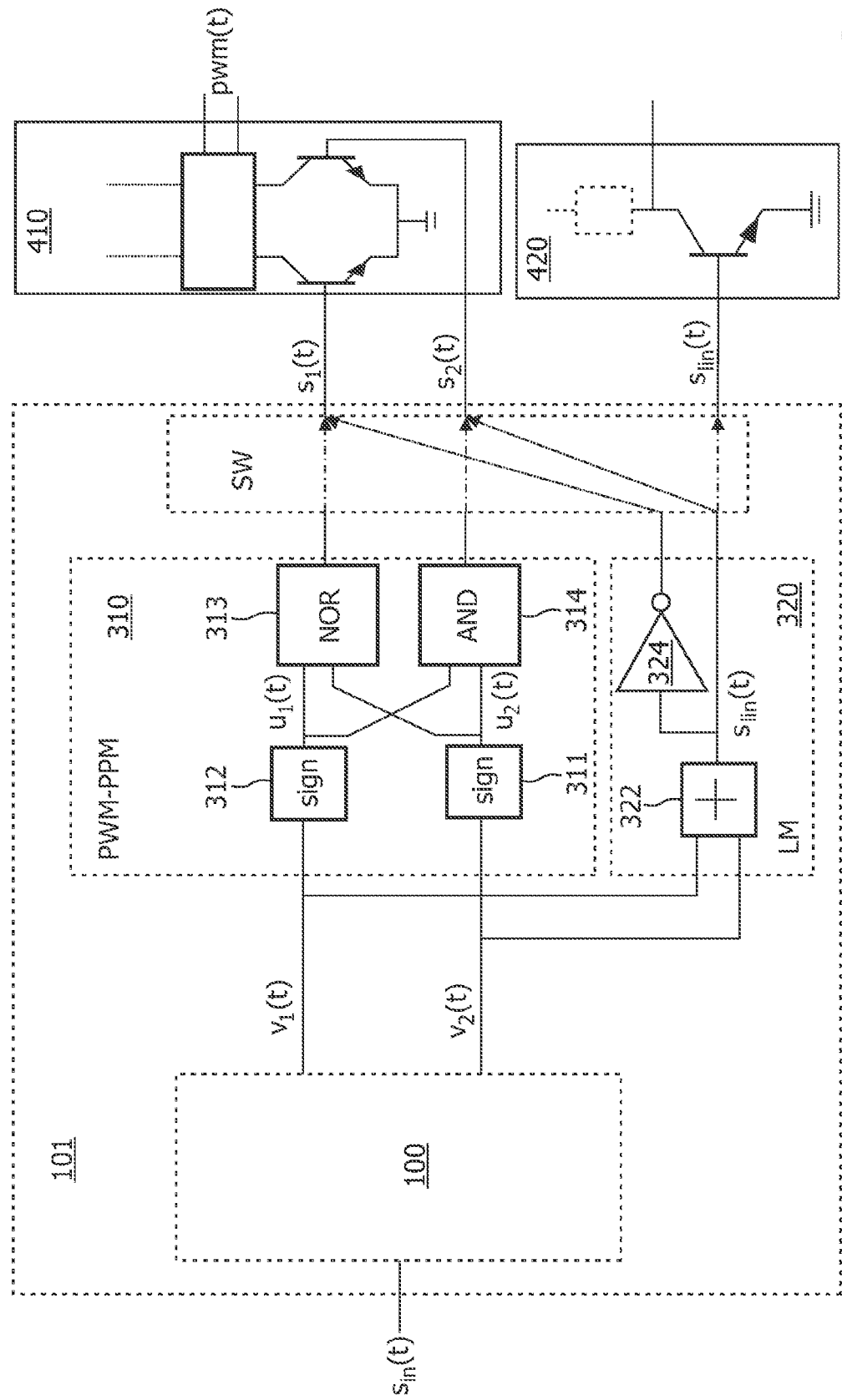
FIG. 2 is an illustration of the first embodiment of the modulator comprising a PWM-PPM-mode and the second embodiment of the modulator comprising a LM-mode.

A first embodiment of the second aspect of the invention is illustrated in FIG. 2. The phase modulated carrier signals $v_1(t)$ and $v_2(t)$ are supplied to first combination means 310 providing for the PWM-PPM-mode of the modulator 101 according to the invention. In the first combination means 310 the modulated carrier signals $v_1(t)$ and $v_2(t)$ are input to respective limiters or sign functions 311 and 312, which provide for two respective phase-modulated two-level signals $u_1(t)$ and $u_2(t)$. The phase modulated two-level signals $u_1(t)$ and $u_2(t)$ are given by equations (12) and (13):

$$u_1(t)=\text{sign}(\sin((\omega_c t+\Phi_P(t)+\Phi_M(t))) \quad (12)$$

$$u_2(t)=\text{sign}(\sin((\omega_c t+\Phi_P(t)-\Phi_M(t))) \quad (13)$$

As can be seen, the phase modulation caused by $\Phi_M(t)$ and $-\Phi_M(t)$ shift each of the RF carriers into opposite directions. This effect can be used to construct a pulse (train) signal with varying pulse width, a pulse width modulated signal: the PWM signal. This may be done by combining $u_1(t)$ and $u_2(t)$ by means of a NOR-function 313 and an AND-function 314, respectively. This is also expressed in equations (14) and (15):

$$s_1(t) = \overline{u_1(t) \vee u_2(t)} \quad (14)$$

$$s_2(t) = u_1(t) \wedge u_2(t) \quad (15)$$

The phase modulation caused by $\Phi_P(t)$ causes the same phase modulation for both phase modulated carrier signals $v_1(t)$ and $v_2(t)$, which causes a phase modulation (PM) of the pulse width modulated signals $s_1(t)$ and/or $s_2(t)$. It is worth noting that as well an $s_1(t)$ and $s_2(t)$ can be used as a phase modulated PWM signal, to drive an unbalanced PA configuration.

A balanced signal can be constructed out of the signals $s_1(t)$ and $s_2(t)$ as follows:

$$pwm(t)=s_1(t)-s_2(t) \quad (16)$$

The balanced signal pwm(t) may be produced by means of a differential amplifier 410, whereby a further reduction of unwanted frequency components can be achieved.

Figure 3:
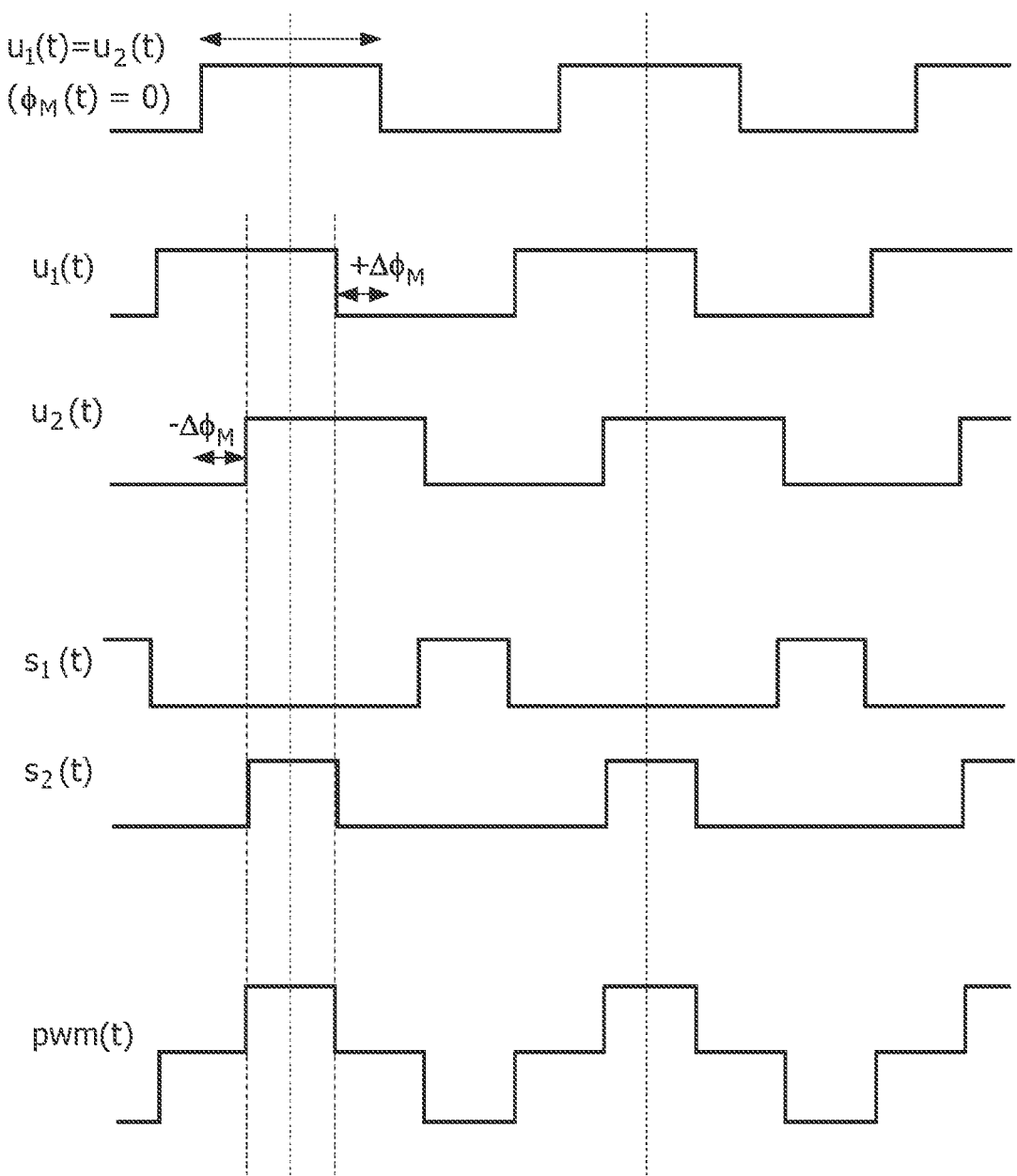
FIG. 3 is an illustration of the signal processing by the modulator of FIGS. 1 and 2.
Figure 4:
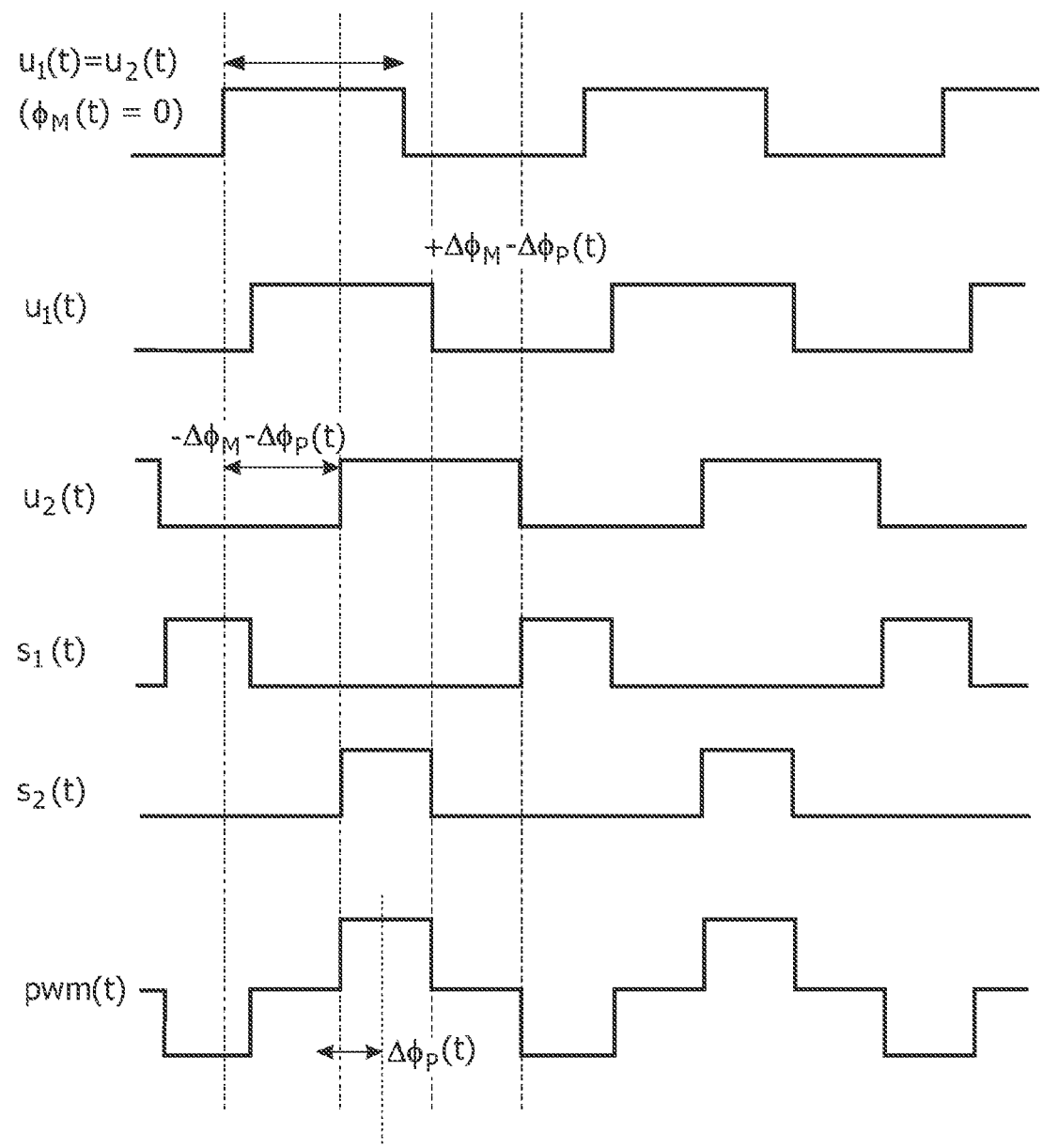
FIG. 4 is a further illustration of the signal processing by the modulator of FIGS. 1 and 2.
Figure 5:
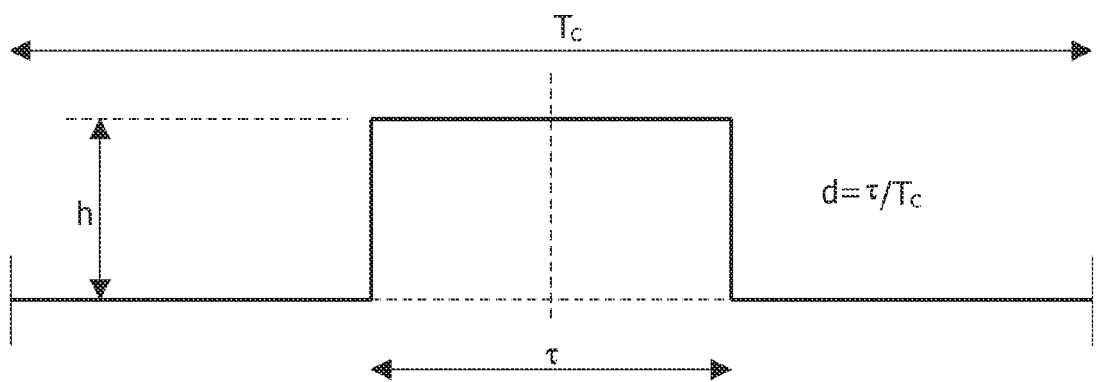
FIG. 5 is a pulse of a pulse train signal for illustration of the used mathematical expressions.

A visual presentation of the principle disclosed above is depicted in FIG. 3 and FIG. 4, wherein the waveform at the respective top is a reference with the assumption $\Phi_M(t)=0$. FIG. 3 demonstrates the generation of the pulse width modulation PWM by $\Phi_M(t)$. FIG. 4 demonstrates the phase modulation of the PWM modulated signals by $\Phi_P(t)$.

According to a second aspect of the invention, a normal envelope and phase modulated RF carrier signal $s_{lin}(t)$ can be constructed. The linear modulated carrier signal $s_{lin}(t)$ may be obtained from the output phase modulated carrier signals $v_1(t)$ and $v_2(t)$ of the core of the modulator 100 by the in the $s_{lin}(t)$ is amplitude- and phase-modulated signal. The relation between following equations second combining means 320. In the second combining, adder means 323 merge the signals $v_1(t)$ and $v_2(t)$ such that the linear modulated carrier signal $s_{lin}(t)$ is produced. This results for the signal $s_{lin}(t)$:

$$S_{lin}(t) = v_1(t) + v_2(t) \quad (18)$$
$$= \sin(\omega_c t + \Phi_P(t) + \Phi_M(t)) + \sin(\omega_c t + \Phi_P(t) - \Phi_M(t))$$
$$= 2\cos(\Phi_M(t))\sin(\omega_c t + \Phi_P(t))$$

The linear modulated carrier signal the phase modulation, which is responsible for the AM modulation and the desired envelope, is:

$$\Phi_M(t) = \arccos(A(t)) \quad (21)$$

Hence, another pre-distortion of the envelope signal (the amplitude modulation information) is needed. Again, also in this LM-mode there is no need for pre-distortion of the phase modulation of the RF carrier. The linear modulated carrier signal $s_{lin}(t)$ may be used for driving an unbalanced power amplifier 420. Furthermore, by additional inversion means 324, for example an operational amplifier (with gain v=−1), an inverse version $-s_{lin}(t)$ of the linear modulated carrier signal $s_{lin}(t)$ is provided. Now, with both versions of the linear modulated carrier signal $-s_{lin}(t)$ and $s_{lin}(t)$ also a balanced signal pwm(t) can be constructed out of the signals $-s_{lin}(t)$ and $s_{lin}(t)$ by means of the differential amplifier 410, whereby a further reduction of unwanted frequency components could be achieved. As can be seen, this way of constructing the balanced signal for driving a PA is much less complex as the first embodiment. Accordingly, by an additional switch SW the modulator comprises the flexibility to be used in multi-mode concepts, as discussed above.

Additionally, in case of constant envelope signals (only PM) or when the AM modulation is done after the switching power device the pulse width modulation could be used for AGC or Power control. The power control method above can also be used in combination with the conventional way of power control by simply adapting the power supply of the PA. The combination will result in a higher dynamic range for the power control.

An important benefit is the flexibility of the concept of the invention, because which nearly no changes in the external RF circuits it is possible to use the invention for linear PA concepts, which makes the principle attractive for multi-mode concepts. Suitable application areas of the invention include, but are not limited to, efficient modulated transmitters for WLAN, WPAN, Blue-Tooth, OFDM, GSM, UMTS, CDMA, low-power mobile communication devices.

In case of constant envelope signals (only PM) or when the AM modulation is done after the switching power device the pulse width modulation could be used for AGC or Power control. The Power Control method can also be used in combination with the conventional way of Power Control by simply adapting the power supply of the PA. The combination will result in a higher dynamic range for the power control. An important feature is the flexibility of this concept, because which hardly any changes in the external RF circuits it is possible to use the invention for linear PA concepts, which makes the principle attractive for multi-mode concepts.

The present invention relates in general to transferring the envelope information of a polar modulated signal to a varying pulsewidth signal, while the phase modulation is direct transferred to the phase modulation of this PWM signal. Accordingly, the resultant signal is a PWM-PPM-signal. Such a signal can efficiently amplified by use of switching amplifying stages. By the present invention four pre-distorted baseband signals are applied basically to 4 linear RF mixers and a two adders, which are, the only needed external RF building blocks to build the modulator. That is, the basic idea of the invention resides in the way of modulation of the four baseband signals and the way of combining of the RF modulated signals.

While there have been shown and described and pointed out fundamental features of the invention as applied to the preferred embodiments thereof, it will be understood that various omissions and substitutions and changes in the form and details of the devices and methods described may be made by those skilled in the art without departing from the present invention. For example, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of designed choice. It is the intention, therefore, to be limited only as indicated by the scope of the claim s appended hereto.

Finally but yet importantly, it is noted that the term "comprises" or "comprising" when used in the specification including the claim s is intended to specify the presence of stated features, means, steps or components, but does not exclude the presence or addition of one or more other features, means, steps, components or group thereof Further, the word "a" or "an" preceding an element in a claim does not exclude the presence of a plurality of such elements. Moreover, any reference sign does not limit the scope of the claims.

The invention claimed is:

1. Method for generating a first and a second phase modulated carrier signal from a polar modulated input signal for construction of a driving signal for a power amplifier, the method comprising the steps of:

deriving a first modulator argument and second modulator argument by summing and subtracting, respectively, a first phase information corresponding to the amplitude of an input signal to and from, respectively, a second phase information corresponding to the phase of the input signal;

generating a first and a second baseband signal by respectively transforming the first modulator argument with a first sin-functionality and a first cos-functionality and generating a third and a fourth baseband signal by respectively transforming the second modulator argument with a second sin-functionality and a second cos-functionality;

mixing respectively the first and the third baseband signal with a cos-component of a quadrature carrier signal to a first and a third carrier product and respectively the second and the fourth baseband signal with a sin-component of the quadrature carrier signal to a second and a fourth carrier product; and adding the first to the second carrier product and the third to the fourth carrier product, respectively, to output a first and a second phase modulated carrier signal, respectively.

2. Method according to claim 1, comprising further the step of limiting each of the first and the second phase modulated carrier signals to a first two-level phase modulated carrier signal and a second two-level phase modulated carrier signal.

3. Method according to claim 2, comprising further the step of combining the first and the second two-level phase modulated carrier signals by a NOR-functionality to a first phase modulated pulse width signal, and combining the first and the second two-level phase modulated carrier signals by a AND-functionality to a second phase modulated pulse width signal.

4. Method according to claim 3, comprising further the step of driving an unbalanced power amplifier with one of the first and the second phase modulated pulse width signals.

5. Method according to claim 3, comprising further the step of forming a balanced phase- and pulse width-modulated carrier signal for driving a power amplifier by combining the first and the second phase modulated pulse width signals by differential amplifying.

6. Method according to claim 1, comprising further the step of merging the first and the second phase modulated carrier signals to a envelope and phase modulated carrier signal for driving a power amplifier in linear mode.

7. Modulator for generating a first and a second phase modulated carrier signal from a polar modulated input signal, the modulator comprising:
pre-distortion means configured to derive a first modulator argument and a second modulator argument as a sum and a difference, respectively, of a first phase information corresponding to the amplitude of an input signal and a second phase information corresponding to the phase of the input signal;
baseband signal generating means connected to the pre-distortion means, the baseband signal generating means configured to generate a first baseband signal and a second baseband signal by respectively transforming the first modulator argument by a first sin-functionality and a first cos-functionality and configured to generate a third baseband signal and a fourth baseband signal by respectively transforming the second modulator argument by a second sin-functionality and by a second cos-functionality;
first linear mixing means and third linear mixing means each configured to multiply a input signal with a cos-component of a quadrature carrier signal to output a first carrier product and a third carrier product, respectively, and second linear mixing means and a fourth linear mixing means each configured to multiply a input signal with a sin-component of the quadrature carrier signal to output a third carrier product and a fourth carrier product, respectively, wherein the first baseband signal is input to the first linear mixing means, the second baseband signal is input to the second linear mixing means, the third baseband signal is input to the third linear mixing means, and the fourth baseband signal is input to the fourth linear mixing means; and
first summing means configured to sum the first carrier product and the second carrier product and configured to output a first phase modulated carrier signal, and second summing means configured to sum the third carrier product and the fourth carrier product and configured to output a second phase modulated carrier signal.

8. Modulator according to claim 7, further comprising a first combining means having a first and second limiting means or signum-functionality configured to limit the first phase modulated carrier signal and the second phase modulated carrier signal, respectively, to a first two-level phase modulated carrier signal and a second two-level phase modulated carrier signal, respectively; and a NOR-functionality and a AND-functionality, the first phase modulated carrier signal and the second phase modulated carrier signal both input to the NOR-functionality and the AND-functionality, wherein the NOR-functionality and the AND-functionality are respectively configured to combine the first two-level phase modulated carrier signal and the second two-level phase modulated carrier signal, wherein an output of the NOR-functionality is a first phase modulated pulse width signal and an output of the AND-functionality is a second phase modulated pulse width signal.

9. Modulator according to claim 7, further comprising a second combining means having a summing means configured to sum the first phase modulated carrier signal and the second phase modulated carrier signal to an envelope- and phase-modulated carrier signal.

10. Modulator according to claim 9, the second combining means further comprising an inversion means connected to an output of the summing means and configured to provide a inverse version of the envelope- and phase-modulated carrier signal.

* * * * *